US006975106B1

(12) United States Patent
Wallace et al.

(10) Patent No.: US 6,975,106 B1
(45) Date of Patent: Dec. 13, 2005

(54) PHASE LOCKED TIME INTERVAL ANALYZER

(75) Inventors: Hugh S. Wallace, Fort Collins, CO (US); G. Robert Elsheimer, Fort Collins, CO (US); Ceceli Ann Wilhelmi, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/966,229

(22) Filed: Oct. 15, 2004

(51) Int. Cl.[7] .............................................. H03B 1/04
(52) U.S. Cl. ..................................... 324/158.1; 331/47
(58) Field of Search ......................................... 331/47

(56) References Cited

U.S. PATENT DOCUMENTS

| 4,164,648 | A | | 8/1979 | Chu |
| 5,027,085 | A | * | 6/1991 | DeVito ........................ 331/1 A |
| 6,295,315 | B1 | | 9/2001 | Frisch et al. |
| 6,469,493 | B1 | * | 10/2002 | Muething et al. ......... 324/158.1 |
| 6,538,516 | B2 | * | 3/2003 | Lenk ............................. 331/2 |
| 6,640,311 | B1 | * | 10/2003 | Knowles ..................... 713/501 |

FOREIGN PATENT DOCUMENTS

WO    WO01/69328 A2    9/2001

* cited by examiner

Primary Examiner—Vinh Nguyen
Assistant Examiner—Russell M. Kobert

(57) ABSTRACT

A method of analysis of a time interval between two selected measurement edges of interest includes locking a plurality of at least three substantially interchangeable oscillators to a common reference frequency, the oscillators containing digital locked-loop (DLL) circuit architecture. The method includes operating one oscillator as a timebase oscillator, and operating the other oscillators as edge-resettable measurement oscillators. The method further includes coupling one oscillator with a switched and physically-immutable parametric variation, producing an offset in the frequency of the coupled oscillator relative to the frequency of the other oscillators. The method includes phase-aligning each of the measurement oscillators to a triggering pulse created by one of selected measurement edges of interest, oscillating each phase-aligned measurement oscillator until its phase matches the phase of the timebase oscillator, and counting the number of oscillation cycles of the phase-aligned measurement oscillator from the time of phase-alignment until the time of phase matching.

20 Claims, 5 Drawing Sheets

PHASE LOCKED TIME INTERVAL ANALYZER

BACKGROUND OF THE INVENTION

U.S. Pat. No. 4,164,648 (hereinafter referred to as "HP TIA," where "TIA" is an abbreviation for "time interval analyzer") describes an approach to time interval measurement using three analog phase locked loops. Additionally, this patent identifies the shortcomings of a two-ring oscillator time vernier approach, described for example in U.S. Pat. No. 6,295,315 and PCT International Patent WO 01/69328 A2 (hereinafter referred to as "traditional"), currently used almost exclusively. In accordance with HP TIA, all loops are locked to a common reference frequency. Two of the loops differ slightly from a third loop, referred to as the "reference." Implementation is almost exclusively via analog circuitry.

Using analog PLL circuit techniques of HP TIA, three oscillators are locked to a system clock. One is a reference signal oscillator, and the remaining two are measurement oscillators. The measurement oscillators are locked to a frequency that differs from the reference signal by 1+1/N or 1−1/N, where N is an integer. Given an arbitrary phase and frequency start of a measurement oscillator, the phase of the measurement signal gains (or loses) until it matches the phase of the reference signal. Phase alignment requires a number of reference signal clock cycles, wherein the number of cycles is determined by the value of N.

The traditional circuit approach uses only two free running ring oscillators, whose slightly differing frequencies are calibrated at the start of the circuit operation, usually just after reset. The phase measurement is made using a measurement edge to start each oscillator and, like the HP TIA circuit above, counts how many clock cycles elapse for the phases to align. The free running oscillators, even if initially calibrated accurately, are unlikely to retain calibration at the time of measurement, if measurement occurs significantly later. The traditional circuits leave the oscillators off before a measurement, such that the precise dynamic bias conditions that existed during calibration will not apply during the measurement, if the oscillators are off for any significant period of time. If the oscillators are left on, the elapsed time between calibration and measurement may allow for a drift in the frequencies in either or both of the oscillators.

BRIEF SUMMARY OF THE INVENTION

In accordance with embodiments of the present invention, a circuit operable to perform analysis of a time interval between two measurement edges of interest in a data bit stream is provided. The circuit includes a plurality of at least three substantially interchangeable oscillators configured to be locked to a common reference frequency. The oscillators include digital locked-loop (DLL) circuit architecture. One oscillator of the plurality of oscillators is operable to function in the role of a timebase oscillator, whereas the other oscillators are operable to function in the roles of edge-resettable measurement oscillators. One oscillator of the plurality of oscillators includes a switched and physically-immutable parametric variation operable to produce an offset in the frequency of the oscillator relative to the frequency of the other oscillators. The circuit additionally includes a plurality of phase detectors, each phase detector coupled to one of the plurality of oscillators.

In accordance with embodiments of the present invention, a method of analysis of a time interval between two selected measurement edges of interest in a data bit stream (or streams) is provided. The method includes locking a plurality of at least three substantially interchangeable oscillators to a common reference frequency, the oscillators containing digital locked-loop (DLL) circuit architecture. The method includes operating one oscillator of the plurality of oscillators as a timebase oscillator, and operating the other oscillators as edge-resettable measurement oscillators. The method further includes coupling one oscillator of the plurality of oscillators with a switched and physically-immutable parametric variation, producing an offset in the frequency of the coupled oscillator relative to the frequency of the other oscillators. The method includes phase-aligning each of the measurement oscillators to a triggering pulse created by one of selected measurement edges of interest, oscillating each phase-aligned measurement oscillator until its phase matches the phase of the timebase oscillator, and counting the number of oscillation cycles of the phase-aligned measurement oscillator from the time of phase-alignment until the time of phase matching.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1A:
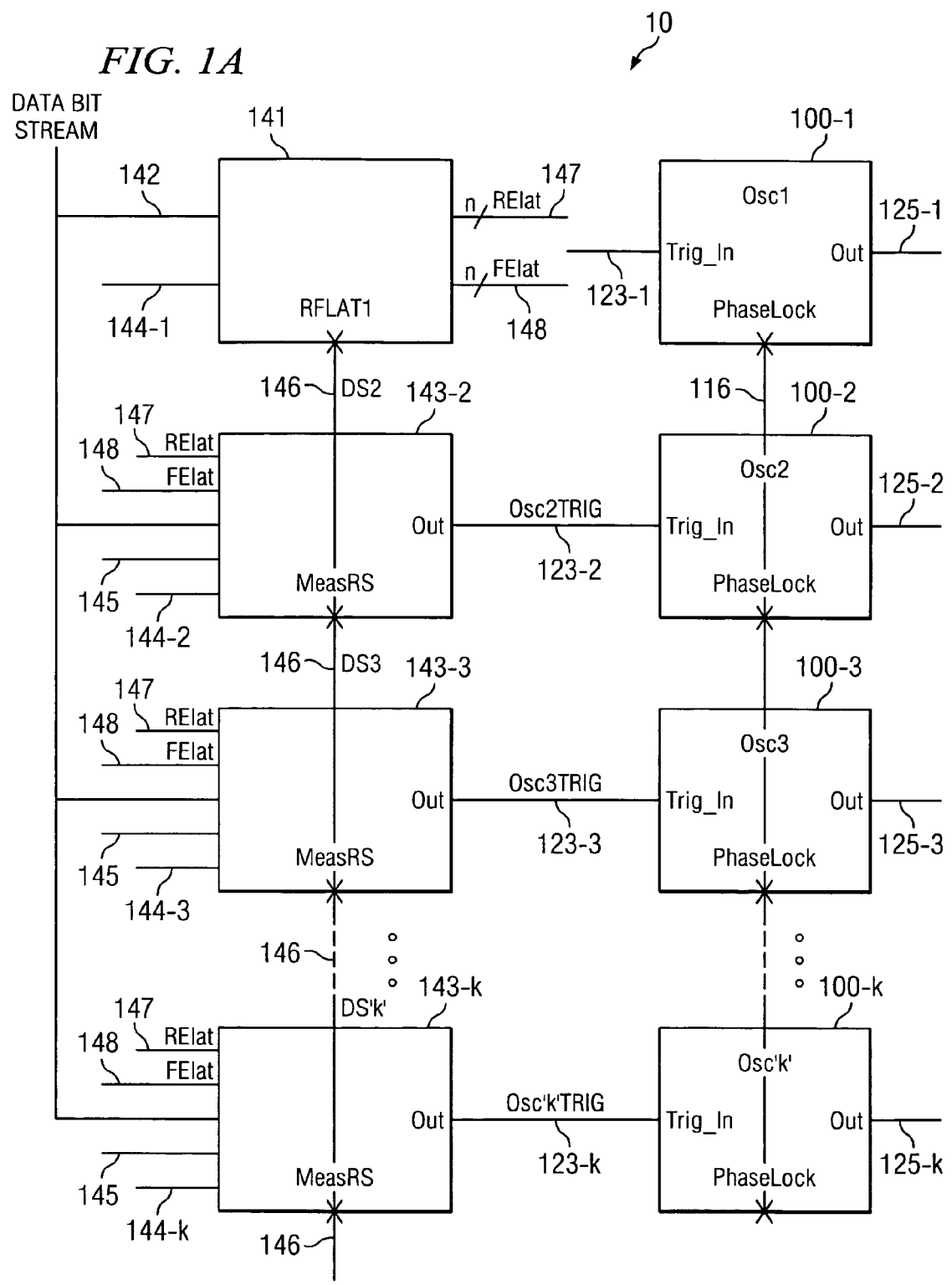
FIG. 1A is a block diagram of a data sampler portion of a digital TIA, in accordance with the present invention.

FIG. 1A is a block diagram of data sampler portion 10 of a digital TIA, in accordance with the present invention. Applying digital circuitry to the topology of HP TIA, three or more oscillators 100-1, 100-2, 100-3, . . . , 100-k provide the time vernier measurement circuitry to determine the time between two data edges of interest. Any oscillator 100-1 through 100-k could be used as the reference oscillator. The remaining oscillators would be phase aligned to the data edges. For example, oscillator 100-1 is used as a reference, whereas at least two oscillators 100-2 through 100-k are phase aligned with selected data edges. Phase alignment is accomplished by stopping the oscillator for a duration approximately T/2 (T is the oscillator's period) and restarting the oscillator in alignment with the phase of the selected data edge in data bit stream 142. The data edge itself creates the triggering pulse to stop and re-start the oscillator.

In operation in accordance with the methodology of the present invention, oscillator 100-2 is phase aligned to the data edge defining the start of a time-interval of interest. However, in accordance with the present methodology, the oscillator roles can and should be commutated (i.e., interchanged) across a series of measurements. Commutating the oscillator roles can help compensate for effects of manufacturing differences, mismatch, or noise effects during the time-interval measurement.

Oscillators 100-2 through 100-k are phase locked to oscillator 100-1 until they receive a Trig_In pulse 123-2 through 123-k from data sample blocks 143-2 through 143-k respectively. The Trig_In pulses momentarily stop the oscillators and then restart them with a starting phase aligned to data edges of interest to the measurement. Oscillators 100-2 through 100-k provide counting signals for time interval measurements between the data edges of interest. Data sample blocks 143-2 through k also include input signals 142 (data bit stream), 145 (edge#) and 144-2 through k (respective rise/fall). Inputs 142, 144, 145, 147, and 148 are discussed below in more detail with regard to FIGS. 3, 4, and 5.

Figure 1B:
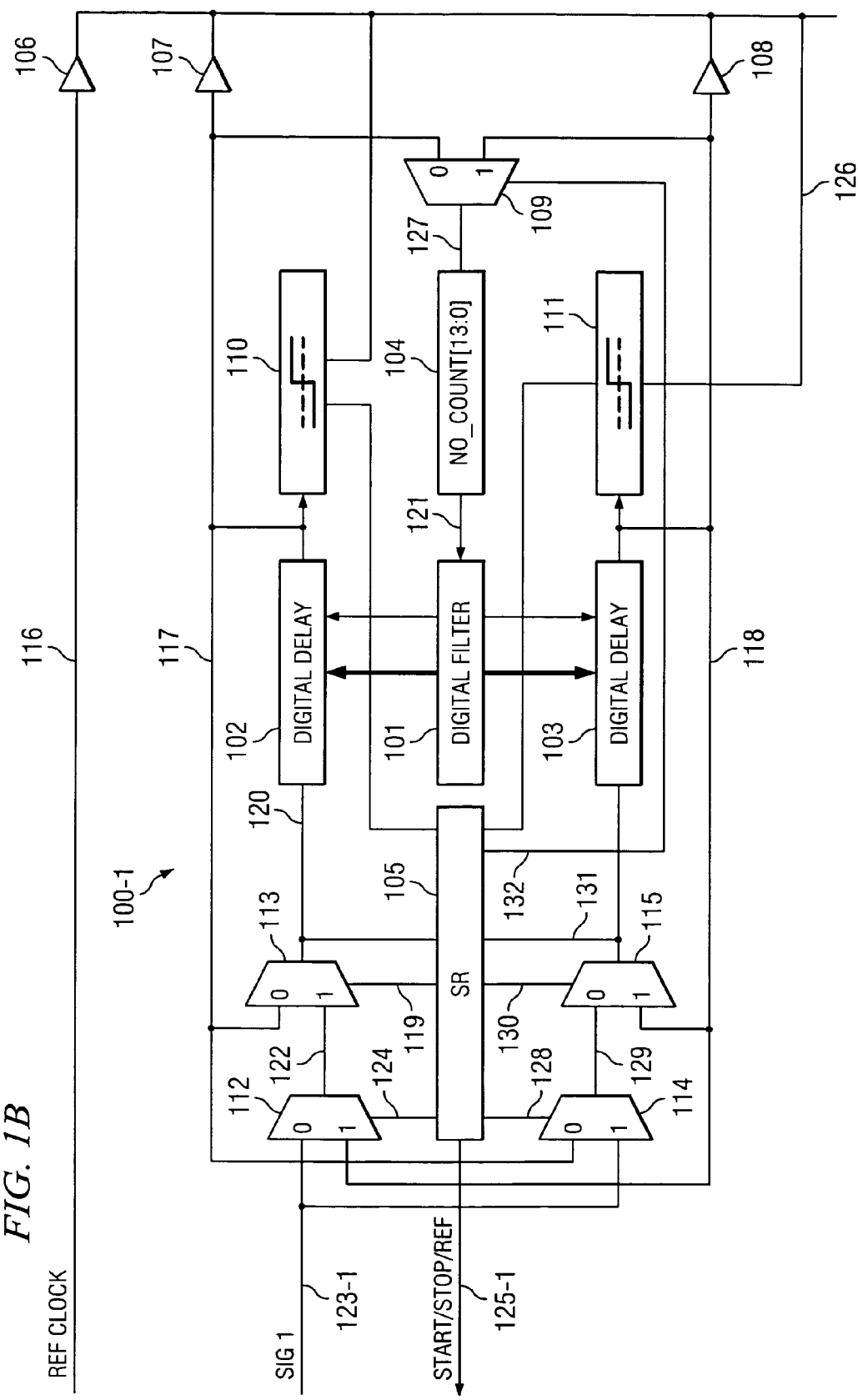
FIG. 1B is a block diagram of a representative oscillator of at least three substantially identical oscillators of a digital TIA, in accordance with an embodiment of the present invention.

FIG. 1B is a block diagram of representative oscillator 100-1 of at least three substantially identical oscillators 100-1 through 100-k of a digital TIA, in accordance with an embodiment of the present invention. At least three of these oscillators are used to provide vernier time measurement circuitry for the digital TIA circuit. One oscillator, without loss of generality designated as oscillator 100-1, is configured to be the timebase clock, and the other two or more oscillators form edge resettable measurement oscillators, such that they are reset by detecting the edge of an incoming signal. In this example embodiment, oscillator 100-1 includes filter 101 that employs phase detector output 110 or 111. It also includes star reset state machine 105, which handles sequencing of multiplexers 112–115 to control a signal T/2 monostable time and oscillator start. Signals 117 and 118 are feedback signals for oscillator 100-1, and signals 119, 130, 124, and 128 are input control signals for multiplexers 112–115. In some embodiments, oscillator 100-1 may include other components or may omit components from FIG. 1B. Many alternative embodiments are within the scope of the present invention.

Figure 2:
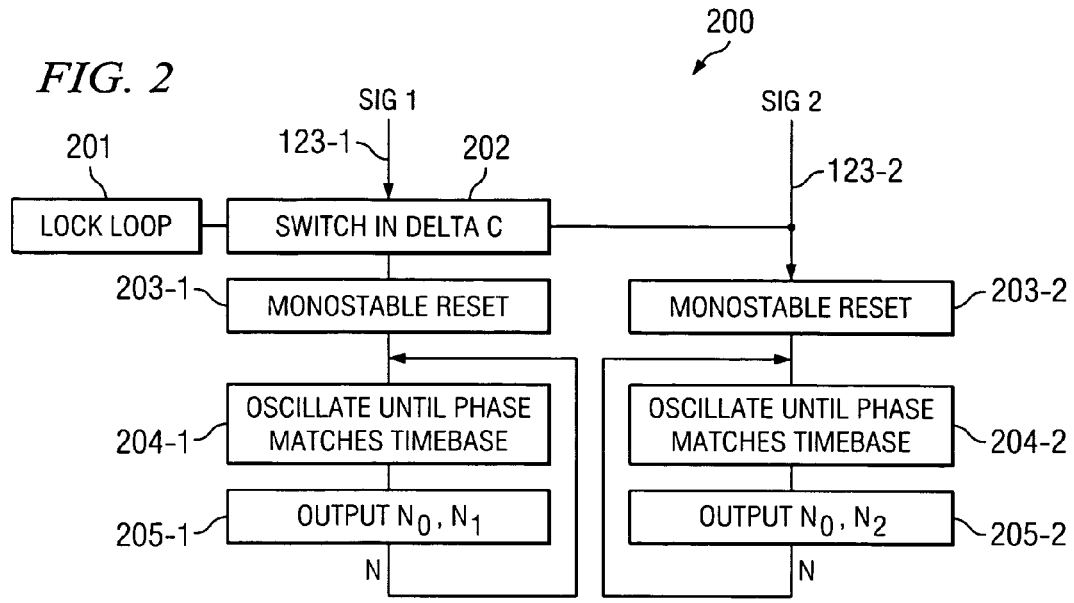
FIG. 2 is a flow diagram depicting an operational sequence of vernier time measurement circuitry of a digital TIA, in accordance with an embodiment of the present invention.

FIG. 2 is a flow diagram depicting operational sequence 200 of vernier time measurement circuitry including oscillators 100-1 through 100-k of a digital TIA, in accordance with an embodiment of the present invention. The discussion of FIG. 2 frquently refers to components shown in FIGS. 1A and 1B. After resetting, oscillator 100-1 has digital locked-loop (DLL) frequency multiplier constants defined in control registers, and state machines are reset to initiate the lock phase in operation 201, allowing both digital delays 102 and 103 to be adjusted to reference clock 116 with the relation:

$$F_{ref\_clock}=1/(2*T_{delay}*N_{mult}).$$

Once DLL 100-1 locks, the frequency of oscillating delay 102 will be $N_{mult}$ times that of reference clock 116. The other delay 103 will have the same $T_{delay}$ as oscillating delay 102, but it is configured as a monostable pulse stretcher by star reset state machine 105 and multiplexers 112—115. This monostable delay 103 is triggered by the edge event of Trig_In 123-1. The pulse it produces resets or holds off delay 103 (operating as an oscillator in this example) in operations 203-1, 203-2 and restarts it on the falling edge of monostabled pulse 123-1. The phase of the restarted oscillator is now related to the edge event of Trig_In 123-1. During Oscillator Monostable reset operations 203-1, 203-2, the frequency of DLL block forming timebase oscillator 102 is changed in operation 202 by a small amount by switching in immutable parasitic load capacitance 133.

Alternatively, capacitance 133 may be added to monostable DLL oscillator 100-2 or reference DLL oscillator 100-1. The bold arrows from filter 101 to delay oscillators 102 and 103 represents coarse delay adjustment to tune oscillators 102 and 103. Similarly, the thin arrows from filter 101 to oscillators 102 and 103 represents an enabler that adds parasitic capacitance for fine adjustment of oscillators 102 and 103. It should be noted that parasitic adjustment is usually used only when delay 103 is used as an oscillator. The small capacitance amount will be derived in additional measurement operations following output operations 205-1, 205-2. When the phase aligns in operations 204-1, 204-2, the number of oscillation cycles $N_0$ that have accumulated in digital counter 104 are recorded in operations 205-1, 205-2. In some embodiments, there will be a certain tolerance between the matches which may be evaluated from subsequent measurements even without the addition of the parasitic capacitance.

By letting the delay oscillators 102 and 103 continue to run for N additional locks, where N can be any positive integer, indicated by adjacent arrows in FIG. 2, iterating operations 204-1, 205-1, and 204-2, 205-2, provides additional measurements that produce output data with a known relation. From this larger data set, noise from the initial measurement can be mitigated, and the frequency difference between the oscillators can be assessed. In the event that the frequency difference is too small or zero, the phase alignment may take too long or never happen. In this case, a watchdog timer or counter resets the circuit and indicates a "did not resolve" error state. The control software/hardware makes an adjustment to immutable switchable capacitance 133 so as to change the frequency offset of delay timebase oscillator 102. This technique can also be used to manipulate the time resolution of the circuit.

In a variation of this circuit, timebase delay 102 is a fixed clock source. By using one circuit block 103, the edges of Trig_In 123-1 can be measured against the fixed timebase if immutable switched capacitive load 133 is switched on delay 103. This configuration allows the edge of Trig_In 123-1 to be compared against delay 102, which is operating as a fixed timebase clock. If enough edges are measured, this forms the basis of an rms jitter measurement.

Figure 3:
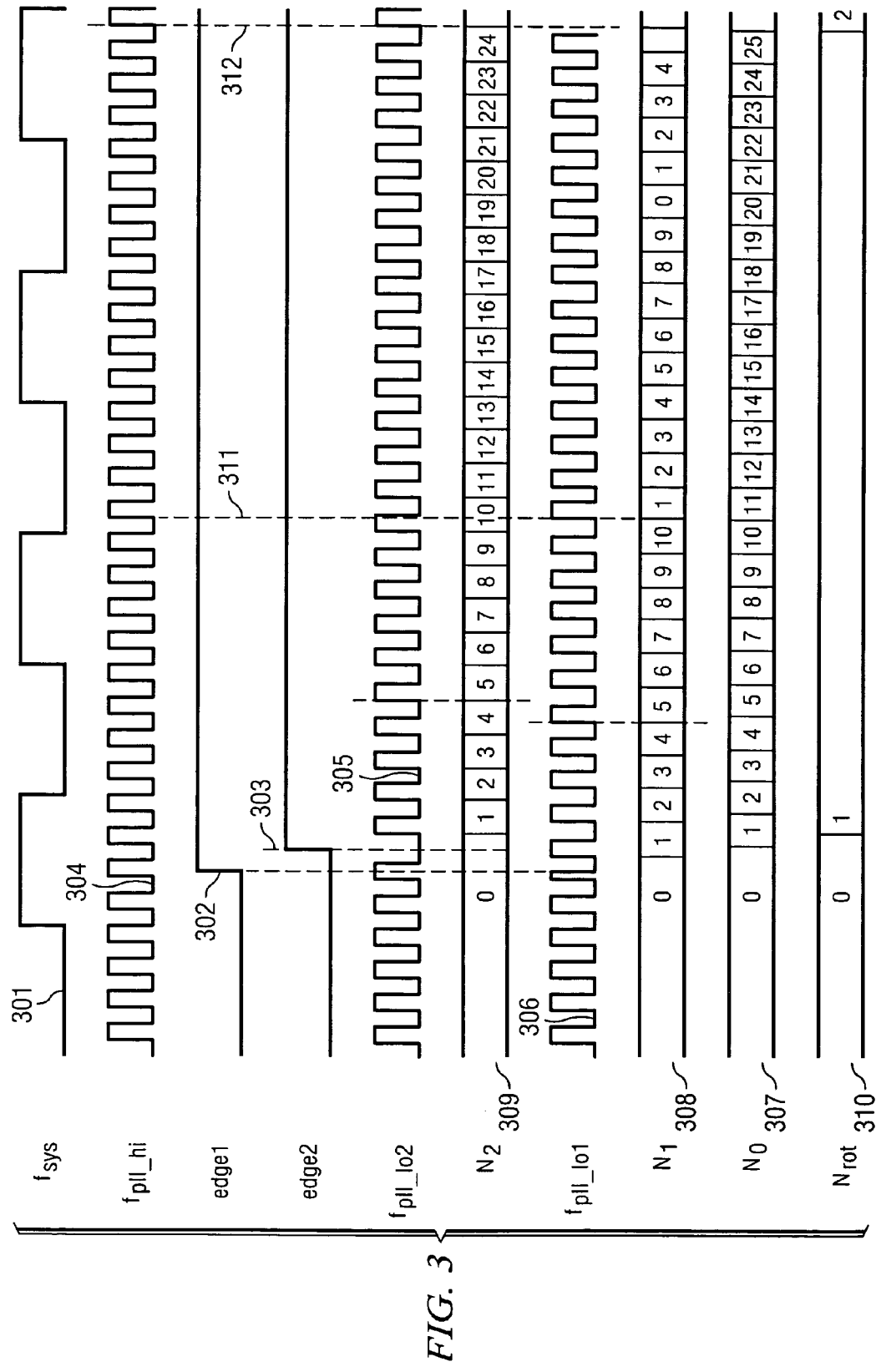
FIG. 3 is a timing diagram showing processes associated with vernier time measurement using a digital TIA, in accordance with embodiments of the present invention.

FIG. 3 is a timing diagram showing processes associated with vernier time measurement 200 using a digital TIA, in accordance with embodiments of the present invention. In this example, Edge1 and Edge2 represent two instantiations of Sig 1 (of FIG. 1B), and $f_{sys}$ is a reference clock, such as clock 116 (FIG. 1B). $f_{pll\_lo1}$ 306 and $f_{pll\_lo2}$ 305 are measurement clock signals. $N_0$, $N_1$, and $N_2$ are counters. Edge1 302 rising halts digital delay 103 $f_{pll\_lo1}$ at edge 302 for half a period before releasing. It takes 10 cycles before this oscillator's phase 302 matches digital delay frequency 102 $f_{pll\_hi}$ 304 (timebase clock) at event 311. Edge2 303 rising halts $f_{pll\_lo2}$ 305 for half a period before releasing. It takes 24 cycles before this oscillator's phase matches $f_{pll\_hi}$ 304 (timebase clock) 312. $N_{rot(ate)}$ 310 is an extension inside digital filter block 101 (of FIG. 1) that counts how many times $N_1$ 308 has rolled over (reached its maximum count and then returned to its minimum count). By recording $N_1$ 308 and $N_{rot}$ 310 for each oscillator match, time differences larger than one timebase clock period can be measured. The timing diagram of FIG. 3 depicts each of them counting after an event (such as Edge1 or Edge2) has caused each to start.

The counters $N_0$, $N_1$, and $N_2$ (307–309, respectively) count the number of cycles for the phase alignment of the measurement oscillator to the reference oscillator. The maximum number of cycles is $N_{max}$, defined as:

$$N_{max}=T_{ref}/(T_{ref}-T_{mx}),$$

where $T_{ref}=1/f_{pll\_hi}$ $T_{mx}=1/f_{pll\_lox}$

In the above example T is a time measurement, such that $T_{mx}$ is the time at an edge being measured, and $T_{ref}$ is the time of a reference edge. The letter "x" denotes which edge is being measured. When an edge (1 or 2) initiates a counter (N) the first value read multiplied by ($T_{ref}-T_{mx}$) gives the time between that edge (1 or 2) being measured and the next reference edge. The time differences for each edge and the value of $N_{rot}$ 310 gives the total time difference between the edges. If the counters are allowed to run, the subsequent readings will increment by $N_{max}$ and indicate the fractional mismatch (reference to measurement)in the oscillators. A plurality of these readings may be used to compute an average in order to reduce the effects of noise. Although this example refers to counters 307–309 and edges 1 and 2, there may be more counters and edges in other embodiments.

Figure 4:
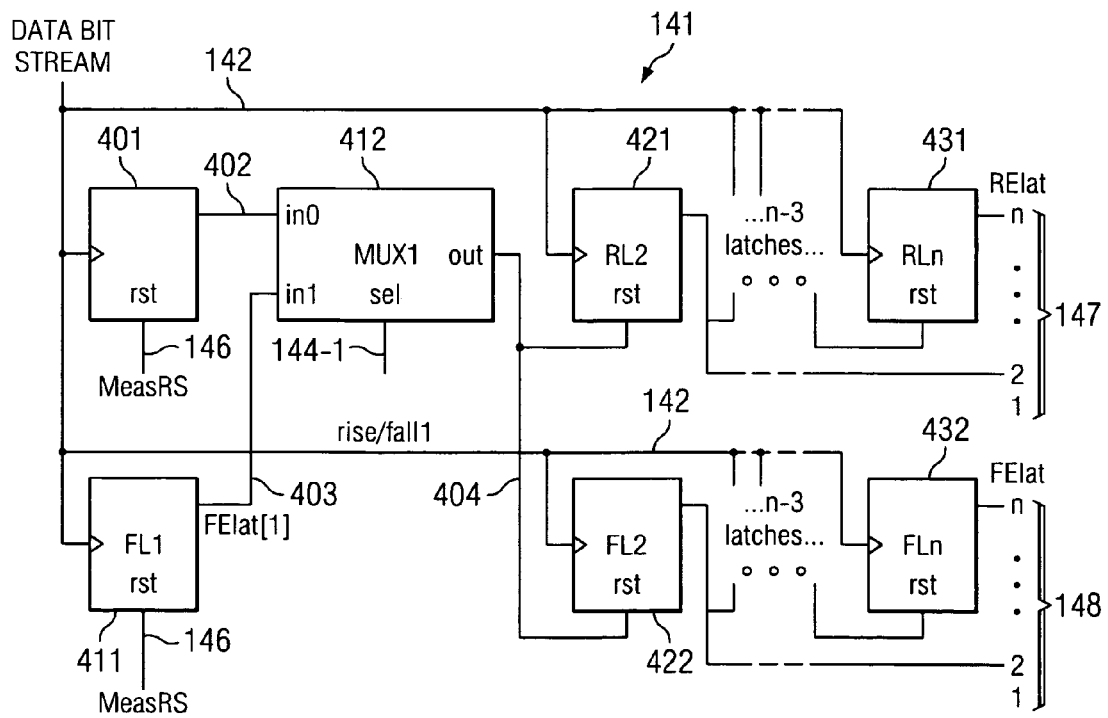
FIG. 4 depicts an architecture embodiment for RFLAT 141, which creates latched signal representations of the rising and the falling data edges in a data bit stream preceding the measurement edge of interest.

Referring again to FIG. 1A, rise and fall edge latches (RFLAT) 141 provide n-dimensional open signals rising edge latch open (RElat) 147 and falling edge latch open (FElat) 148 to data sample blocks 143-1 through 143-k. FIG. 4 depicts an architecture embodiment for RFLAT 141, which creates latched signal representations 147, 148 of the rising and the falling data edges in data bit stream 142 preceding the measurement edge of interest. If a rising edge 'n' is the edge of interest, then the preceding falling data edge latches output signals RElat[n], i.e., 147(n). If a falling edge 'n' is the edge of interest, then the preceding rising data edge latches output signal FElat[n], i.e., 148(n).

For example, rise/fall1 input 144-1 selects whether the beginning of the measurement edge is rising or falling. Rise edge latch (RL)1 401 or fall edge latch (FL)1 411 output 402 or 403 (depending on rise/fall1 at MUX1 412 output 404) is then used to prepare RL2 421 and FL2 422 for triggering. The remaining latches RL2 ... 'n' 421–431 and FL2 ... 'n' 422–432 are cascaded. RL2's output resets RL3 to prepare it for the next falling edge in data bit stream 142. Similarly, FL2's output resets FL3 to prepare it for the next rising edge on the data bit stream. Once RL1 ... 'n' and FL1 ... 'n' are latched, they are cleared and reset by MeasRS signal 146 in order to be re-latched. The MeasRS pulse immediately precedes the time interval measurement.

Referring to FIG. 1A, important conditions for the operation of the Oscillator Triggering Block (composed of data sample trigger blocks 143-2 through 143-k and edge latch block 141) are:

1. Allow only the data edges of interest to flow to oscillator Trig_In nodes 123-1 through 123-k.
2. The oscillator triggering pulses (stop and re-start) received at Trig_In nodes 123-1 through 123-k follow as directly as possible from the data edges in data bit stream 142, i.e., no latches and as few gates as possible between data bit stream 142 and oscillator Trig_In 123-1 through 123-k.
3. Trigger pulse 123-1, ... ,123-k for an oscillator 100-1 through 100-k disables a running oscillator and then re-enables the oscillator at a time T/2 (T is the oscillator's period) after the disable edge.
4. Include the flexibility to phase align the oscillators to either rising or falling data edges.
5. Phase align a multiplicity of oscillators 100-1 through 100-k with data edges.
6. Create trigger pulses 123-2 through 123-k based on selected data edges 1, ... , 'n.'

In order to provide the optimum implementation conditions, pass gates can be used between the data and the oscillator Trig_In node. The use of pass gates minimizes alterations to the timing and shape of the data edges as they propagate to oscillator Trig_In. In one example, the pass gates are opened by edges immediately preceding the data edges of interest. The pass gates are closed immediately following the data edges of interest. Pass gate open signals for successive measurement edges 1 ... n are created by a cascade of latches.

Figure 5:
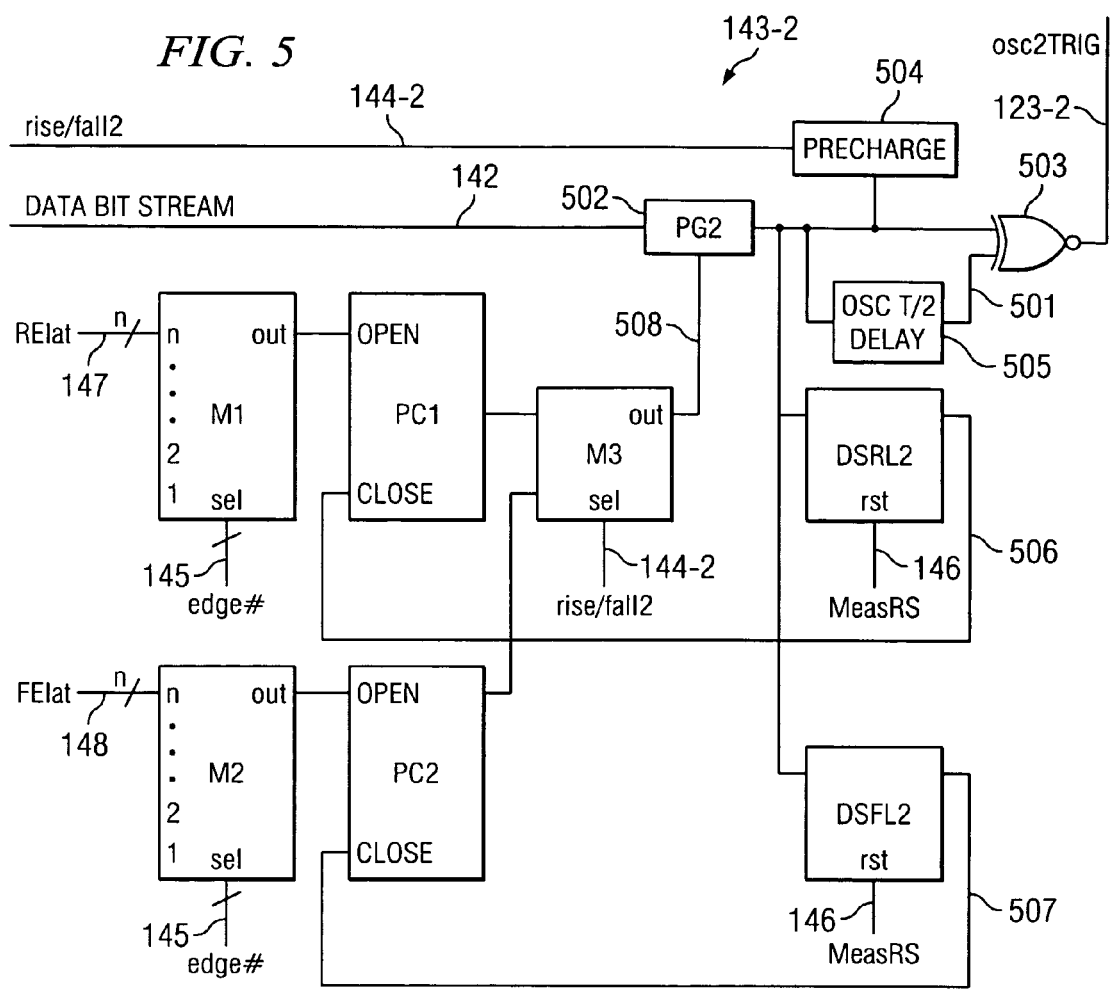
FIG. 5 shows an exemplary architecture for a DataSample block (all Data Sample blocks are identical in design), in accordance with embodiments of the present invention.

The combination of Edge Latch Block 141 and Data Sample blocks 143-2 through 143-k creates triggering pulses for oscillators 100-2 through 100-k, as depicted in FIG. 1A. Data Sample blocks 143-2 through 143-k are identical, which allows oscillators 100-2 through 100-k to be triggered in any chronological order. The oscillators themselves are identical in design and are well matched. RFLAT block 141 provides pass gate open signals for any desired data edge 1 ... 'n' to every Data Sample block 143-2 through 143-k. The Data Sample selection signals, namely edge# 145 and rise/fall2 ... 'k' 144-2 through 144-k are used to choose any edge 1 ... 'n' of either type (rise or fall) to be used in the time interval measurement FIG. 5 shows an exemplary architecture for DataSample2 block 143-2 (in this example, all Data Sample blocks are identical in design), in accordance with embodiments of the present invention. Data Sample blocks receive bit stream 142, RElat 147, FElat 148, edge# 145, and rise/fall signals 144-2 through 144-k as inputs, and provide oscTRIG signals 123-2 through 123-k to Trig_In nodes of oscillators 2 through k (respectively) of FIG. 1. To accomplish this function in DataSample2 block 143-2, pass gate 502 is opened and closed surrounding the desired measurement edge in bit stream 142. The leading edge of triggering pulse 123-2 (output from NOR gate 503 using input 501) stops the oscillator, and the trailing edge restarts the oscillator in phase with the data edge of interest.

Pass gate open signals coming from RElat 147 and FElat 148 are selected with multiplexers M1, M2, and M3. Edge# input 145 to n-way multiplexers M1 and M2 selects which data edge 1 ... 'n' is to be used as the pass gate open signal. Rise/fall2 signal 144-2 to rise/fall multiplexer M3 selects whether pass gate open signal 508 precedes a rising or falling data edge.

Pass gate close signals 506, 507 are generated using DSRL2 and DSFL2 (wherein "DSRL" stands for "data sample rise edge latch," and "DSFL" stands for "data sample fall edge latch") by latching on the data edge of interest passing through pass gate 502. If the data edge of interest is a rising edge, then DSRL2 latches on it. If the data edge of interest is a falling edge, then DSFL2 latches on it. DSRL2 and DSFL2 latches are cleared and reset by MeasRS pulse 146 sent immediately prior to a time interval measurement. Pass Gate Control blocks PC1 and PC2 receive open and close input signals and generate the proper logic signals to open and close pass gate 502. PC1 and PC2 may each, for example, be as simple as a single logic gate.

The data edge of interest is thus passed through pass gate 502 to XNOR (or XOR) gate 503, which generates oscillator triggering pulse TRIG_In 123-2. T/2 timing delay 505 creates the proper enable, disable, re-enable triggering pulse shape for oscillator TRIG_In pulse 123-2.

Figure 6:
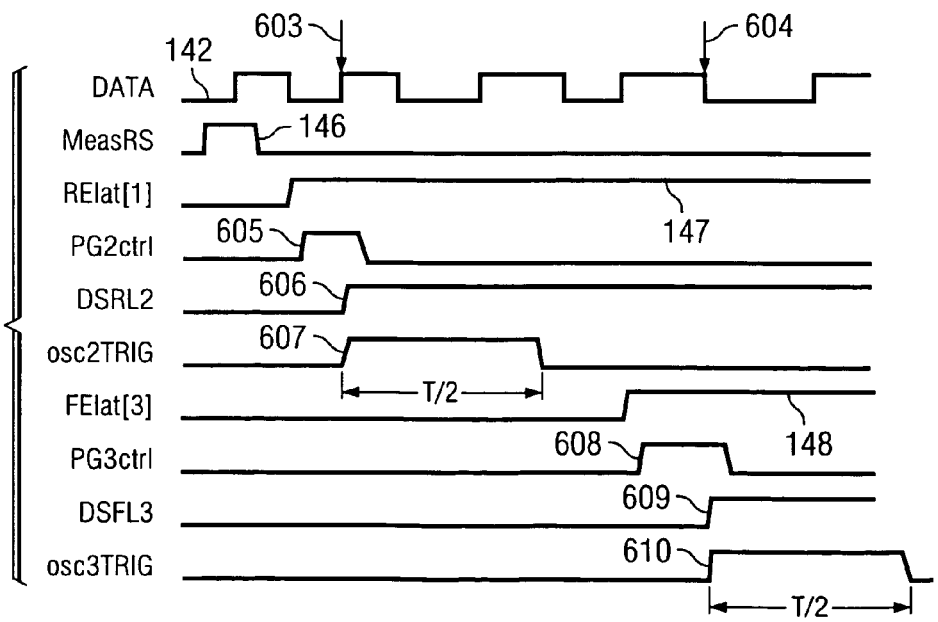
FIG. 6 is a timing diagram depicting the order of timing events of a digital TIA in accordance with an embodiment of the present invention, where a rising data edge of a data bit stream is chosen as the beginning of the measurement time interval.

FIG. 6 is a timing diagram depicting the order of timing events 600 of a digital TIA in accordance with an embodiment of the present invention, where rising data edge 603 of data bit stream 142 is chosen as the beginning of the measurement time interval. The third falling edge 604 following rising edge 603 is selected as the end of the measurement time interval. The order of events is similar if a falling edge is selected as the first measurement edge. Timing events 600 include:

1. Select rising edge 603 as first measurement edge (set rise/fall 144-1 and rise/fall2 144-2 signal lines to rise). Precharge block 504 in DataSample2 charges the inputs to XNOR 503 to logic 0 to prepare for a rising edge propagating through pass gate 502.
2. Select edge# 145=1 for DataSample2 143-2.
3. Select falling edge as the second measurement edge (set rise/fall3 signal line 144-3 to fall). Precharge block 504 in DataSample3 143-3 charges the inputs to XNOR 503 to logic 1 to prepare for a falling edge propagating through pass gate 502.
4. Select edge# 145=4 for DataSample3 143-3.
5. Pulse and release MeasReset line 146 to allow the latches to look for edges.
6. RL1 401 in RFLAT 141 latches on the falling edge preceding the rising data edge 603 of interest, generates RElat[1] 147-1, which opens pass gate 502, in DataSample2 143-2. M3's rise/fall2 144-2 signal selects PC1's output 605 to control pass gate 502.
7. The rising edge of interest propagates through pass gate 502 and arrives at XNOR (or XOR) 503 and OSC T/2 delay block 505.
8. Osc2TRIG 123-2 steady state enable level goes to disable at this time point.
9. Latch DSRL2 606 in DataSample2 143-2 finds the rising measurement edge propagating through pass gate 502, and sends a signal to PC1 to close pass gate 502.
10. Osc2TRIG's level 607 goes back to enable T/2 after the rising measurement edge reaches XNOR (or XOR) gate 503, re-enabling oscillator2 100-2 in T/2 delayed synchronization with rising measurement edge 603.
11. Concurrently with operations 6–10 listed above, FL3 in RFLAT latches on the rising edge preceding the third falling data edge after the rising beginning of measurement edge.
12. FElat[3] signal 148 is selected by M2 in DataSample3 143-3, and pass gate 502 is opened. M3's rise/fall3 signal 144-3 selects PC2's output 608 to control pass gate 502.
13. The falling edge of interest 604 propagates through pass gate 502 and arrives at XNOR (or XOR) 503 and OSC T/2 delay block 505.
14. Osc3TRIG 610 steady state enable level goes to disable at this time point.
15. Latch DSFL2 609 in DataSample2 finds the falling edge propagating through pass gate 502 and sends a signal to PC2 to close pass gate 502.
16. Osc3TRIG level 610 goes back to enable T/2 after rising measurement edge 603 reaches XNOR (or XOR) gate 503, re-enabling oscillator3 100-3 in T/2 delayed synchronization with the third falling edge 604 following rising beginning of measurement edge 603.

Previously described HP TIA was implemented using analog PLL circuitry. The locked PLLs were made open loop before a measurement was made. Opening an analog control loop was not trivial and employed some analog design skill. Embodiments of the present invention use the topology described in HP TIA, except implemented with digital locked loop (DLL) circuitry to integrate more easily with digital processes and to provide enhanced noise assessment and cancellation. The control loop of the DLL according to embodiments of the present invention is simpler to keep stable and to make open loop when a measurement is made.

One of the operations of the traditional TIA technology is to offset the frequencies of the oscillators relative to one another by a small, but known, frequency. In the case of the HP TIA PLLs, the slightly offset PLL frequencies severely compromise the loop bandwidth of the circuit and hence its ability to keep the phase locked in the presence of noise. Traditional techniques, in which the ring oscillators are calibrated, suffer from time taken to calibrate and the lack of control after the calibration.

Embodiments of the present invention lock all of the oscillators to the same low multiple of the system clock and use only a physically immutable control (e.g., capacitance change) of the reference DLL to produce a small offset in the frequency of the reference clock. The control of all oscillators is suspended during measurement to allow noise to affect them all in a substantially identical way. The small frequency offset induced in the reference DLL does not need to be known, as two or more sequential phase measurements provide a measure of the count to align phase (i.e., 0 radians) and the count to align phase $2\pi$ radians later (slip or advance in phase of one DLL relative to the other). The second count relates to the actual frequency difference of the two DLLs. It also serves to provide noise-averaging statistical information concerning the accuracy of the first measurement count. Phase detectors 110, 111 in each oscillator 100-1 through 100-$k$ indicate when the phase of either of the two DLLs aligns with the reference clock. The first time this occurs is defined as 0 radians. If the oscillations are allowed to continue, the phase will eventually align again at phase $2\pi$ radians relative to the previous alignment at 0 radians.

There may still be error incurred by slight offsets of the frequencies. With use of identical oscillator layouts, a commutation process is used to interchange the roles of reference and measurement oscillators. The mathematics of the time commutation process interchangeably designates different circuits for the same function to compensate for error offsets in frequency and delay. The pulse conditioning circuitry and the DLLs are intended to be of identical layout in most embodiments. This enables, for example, three-way commutation among three nominally identical oscillators for pulse steering and three-way commutation for the DLL circuitry. Processing of the acquired sets of commutated data compensates for noise and systematic offsets in the measurements.

Most traditional TIAs make the assumption that any noise processes on the oscillation or phase detection is gaussian. However, power supply noise is known to contain systematic noise from the dominant system clock, which is not gaussian if the signals being measured have any temporal relation to this system clock. Embodiments of the present invention use control over the input signals to search for this clock noise and its effects on the measurement data and to select the optimum time to make the phase measurement. Additionally, whether it is from the power supply or through the substrate, the oscillators have power supply and substrate noise suppressed by using standard layout techniques used by analog designers. Namely, all oscillators use the same power supply lines, and all oscillators are laid out substantially symmetrically to maximize sharing the same noise sources identically with all elements of the oscillators.

Although the present invention and its advantages have been described in detail, it should be understood that various changes, substitutions and alterations can be made herein without departing from the invention as defined by the appended claims. Moreover, the scope of the present application is not intended to be limited to the particular embodiments of the process, machine, manufacture, and composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A circuit operable to perform analysis of a time interval between two measurement edges of interest in a data bit stream, said circuit comprising:
   a plurality of at least three substantially interchangeable oscillators configured to be locked to a common reference frequency, said oscillators comprising digital locked-loop (DLL) circuit architecture;
   a first oscillator of said plurality of oscillators operable to function in the role of a timebase oscillator;
   the other oscillators of said plurality of oscillators operable to function in the roles of edge-resettable measurement oscillators;
   the first oscillator of said plurality of oscillators comprising a switched and physically-immutable parametric variation operable to produce an offset in the frequency of said first oscillator relative to the frequency of said other oscillators; and
   a plurality of phase detectors, each of said phase detectors coupled to one of said plurality of oscillators.

2. The circuit of claim 1 additionally comprising a plurality of counters, each of said counters coupled to one of said plurality of phase detectors.

3. The circuit of claim 1 wherein said switched and physically-immutable parametric variation comprises a small, fixed capacitance.

4. The circuit of claim 1 wherein the respective roles of said oscillators are interchanged by employing commutation and pulse steering, thereby mitigating error offsets in noise, frequency, and delay time.

5. The circuit of claim 1 additionally comprising a plurality of edge latches interconnected with said data bit stream.

6. The circuit of claim 5 wherein said plurality of edge latches comprises rising and falling edge latches.

7. The circuit of claim 5 wherein said plurality of edge latches comprises cascaded edge latches.

8. The circuit of claim 5 additionally comprising a plurality of multiplexers interconnected with said data bit stream and with said plurality of latches and additionally comprising a logic gate configured to transmit to one of said oscillators a measurement edge of interest combined with a time delay pulse from a delay generator.

9. The circuit of claim 8 additionally comprising a pass gate configured to transmit said measurement edge of interest from said data bit stream to said logic gate and to said delay generator.

10. A method of analysis of a time interval between two selected measurement edges of interest in a data bit stream, said method comprising:
    locking a plurality of at least three substantially interchangeable oscillators to a common reference frequency, said oscillators comprising digital locked-loop (DLL) circuit architecture;
    operating a first oscillator of said plurality of oscillators as a timebase oscillator;
    operating the other oscillators of said plurality of oscillators as edge-resettable measurement oscillators;
    coupling the first oscillator of said plurality of oscillators with a switched and physically-immutable parametric variation, producing an offset in the frequency of said coupled oscillator relative to the frequency of said other oscillators;
    phase-aligning each of said measurement oscillators to a triggering pulse created by one of selected measurement edges of interest;
    oscillating each said phase-aligned measurement oscillator until its phase matches the phase of said timebase oscillator; and
    counting the number of oscillation cycles of each said phase-aligned measurement oscillator from the time of said phase-alignment until the time of said phase matching.

11. The method of claim 10 additionally comprising iterating said oscillating and said counting, thereby averaging noise across a larger data set.

12. The method of claim 11 whereby said iterating provides an evaluation of said switched and physically-immutable parametric variation and wherein said switched and physically-immutable parametric variation comprises a small, fixed capacitance.

13. The method of claim 10 wherein the respective roles of said oscillators are interchanged by commutation and pulse steering, thereby mitigating error offsets in noise, frequency, and delay time.

14. The method of claim 10 wherein creating said triggering pulse comprises transmitting said selected measurement edge of interest through a pass gate.

15. The method of claim 14 wherein creating said triggering pulse comprises generating a time delay pulse using said pass gate transmitted measurement edge and combining said time delay pulse with said pass gate transmitted measurement edge through a logic gate and wherein said selected measurement edge is transmitted through said pass gate in response to selected latched measurement edge signals.

16. The method of claim 10 wherein said phase-aligning comprises stopping said first oscillator for a duration approximately one-half of the period of oscillation of said oscillator and then restarting said oscillator.

17. The method of claim 10 wherein said locking to a common reference frequency comprises adjusting said oscillators to said reference frequency with the relation $$F_{ref\_clock}=1/(2*T_{delay}*N_{mult}),$$

where $F_{ref\_clock}$ is the reference frequency, $T_{delay}$ is the time delay, and $N_{mult}$ is the relative multiplication factor.

18. A system operable to perform analysis of a time interval between two measurement edges of interest in a data bit stream, said system comprising:

first, second, and third means for oscillating, wherein the means for oscillating are locked to a common reference frequency;

means for producing an offset in the frequency of the first means for oscillating relative to the frequency of said second and third means for oscillating;

means for phase-aligning each of said second and third means for oscillating to a triggering pulse created by one of said measurement edges of interest;

means for oscillating each said second and third means for oscillating until its phase matches the phase of said first oscillating means; and means for counting the number of oscillation cycles of each said second and third means for oscillating from the time of said phase-alignment until the time of said phase matching.

19. The system of claim 18 wherein the first means for oscillating is operated as a timebase oscillator.

20. The system of claim 18 wherein the second and third means for oscillating are operated as edge-resettable measurement oscillators.

* * * * *